United States Patent [19]

Schertz et al.

[11] 4,243,954
[45] Jan. 6, 1981

[54] LOW LEVEL LC OSCILLATOR

[75] Inventors: Burtron D. Schertz, Kokomo; Frederick A. Aldridge, Russiaville, both of Ind.

[73] Assignee: General Motors Corporation, Detroit, Mich.

[21] Appl. No.: 50,074

[22] Filed: Jun. 19, 1979

[51] Int. Cl.³ .............................................. H03B 5/12
[52] U.S. Cl. ................................. 331/117 R; 331/186
[58] Field of Search .......... 331/117 R, 108 D, 116 R, 331/167, 168, 177 V, 186

[56] References Cited

U.S. PATENT DOCUMENTS

| 3,579,115 | 5/1971 | Goncharoff et al. | 331/36 X |
| 3,649,929 | 3/1972 | Thompson | 331/117 R X |
| 4,058,771 | 11/1977 | Ohsawa et al. | 455/332 |

Primary Examiner—Siegfried H. Grimm
Attorney, Agent, or Firm—Robert M. Sigler

[57] ABSTRACT

A local oscillator suitable for integrated circuit construction in a radio receiver maintains low level voltage oscillations across a tank circuit which may include a varactor diode. An emitter-coupled pair of transistors with a small switch-over voltage has the collector of the second transistor connected to the base of the first. Third and fourth matching transistors have emitters connected to the bases of the second and first transistors, respectively, and grounded collectors. The base of the third transistor is connected through a diode to ground; while the base of the fourth transistor is connected through a matching diode and the tank circuit to ground. A source of electric power having a voltage greater than two diode drops above ground is effective to supply current through resistors to the bases of the first and second transistors. The small switch-over voltage of the emitter coupled pair and the current reduction from emitter to base of the fourth transistor provide for small voltage swings across the tank circuit to minimize mistracking with the RF tuned circuits.

1 Claim, 1 Drawing Figure

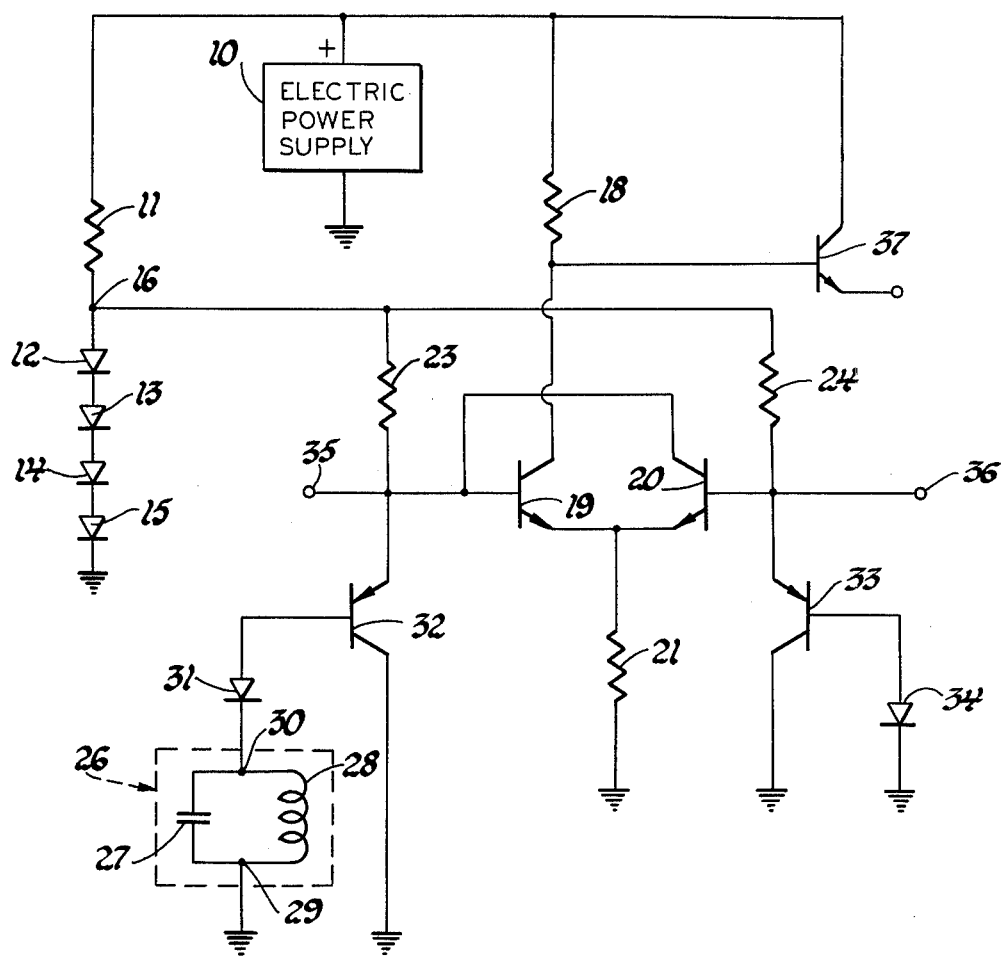

LOW LEVEL LC OSCILLATOR

BACKGROUND OF THE INVENTION

This invention relates to oscillators such as local oscillators for use in radio receivers and particularly to those adapted for integrated circuit construction and designed to be used with tank circuits including varactor diodes.

It is well known in the art of radio design that varactor diodes, whose capacitance varies with applied voltage, are useful in tuned circuits such as local oscillators. However, there are also well known problems associated with such use. One of such problems is that of voltage variation across the varactor diode.

A varactor diode used in a tank circuit for a local oscillator in a radio receiver is generally supplied with a DC bias voltage thereacross to produce a predetermined capacitance. However, the alternating variations in voltage across the tank circuit associated with oscillation cause corresponding changes in this bias voltage across the varactor. The relationship of voltage to capacitance in a varactor is not linear; and therefore the effect of these oscillations can be to shift the average voltage across the varactor away from the predetermined bias. This can lead to mistracking between the local oscillator and the RF stages of the radio if the oscillations across the tank circuit are not maintained at a low level.

In addition, modern radio receiver manufacturing recognizes the advantages of integrated circuits in terms of size, weight and cost of the receiver. Although it is not generally practical to construct tank circuits in this manner, it is desirable to include the remainder of the oscillator components on an integrated circuit, which circuit may include most of the circuit elements of the receiver.

SUMMARY OF THE INVENTION

Therefore, it is an object of this invention to provide an oscillator having components, except for the tank circuit, adaptable for manufacture as an integrated circuit and which further provides for low level oscillations of the tank circuit. It has been discovered that this object may be achieved by taking advantage of the low switch-over voltage of a differential, emitter-coupled pair of transistors, which is a common element of integrated circuits, and by using the current reducing characteristic of another transistor to reduce oscillation level of the tank circuit while supplying a matching transistor to match the temperature dependent voltage variations of the aforementioned transistor. The emitter-coupled pair has a collector of one transistor connected to the base of the other, while the base of the one is maintained by means including the temperature matching transistor at a reference voltage relative to ground. The base of the other transistor is maintained by similar means including the other of the matched transistors at the same reference voltage relative to the tank circuit. A source of electric power is connected through resistors to the bases of the emitter-coupled pair so that switching of the emitter-coupled pair is timed to oscillations of the tank and causes current to be alternately supplied to the tank and to the one transistor. Further details and advantages of this oscillator will be apparent from the accompanying drawing and following description of a preferred embodiment.

BRIEF DESCRIPTION OF THE DRAWINGS

The single FIGURE shows a schematic diagram of the LC oscillator of the invention.

DESCRIPTION OF THE PREFERRED EMBODIMENT

Referring to the FIGURE, an electric power supply or source 10 has an output voltage of $+V$ relative to ground and is further effective to supply current to a load. Electric power supply 10 may include a vehicle battery, alternator and voltage regulator as well as any further voltage regulation included within a vehicle mounted radio receiver. Well known power supply equipment and regulation circuitry presently found on vehicles and in vehicle mounted radios manufactured by the assignee of this invention are entirely adequate to serve as electric power supply 10; any further voltage regulation required is accomplished within the circuit shown in the FIGURE.

Electric power supply 10 is connected through a resistor 11 and a plurality, numbering 4 in this embodiment, of forward biased diodes 12–15 to ground. The voltage at the junction 16 of resistor 11 and diode 12 is therefore maintained at a voltage relative to ground of four forward biased p-n junctions or, in terms of the art, four diode drops. Of course, this voltage will vary with temperature; but such variation will be at least partly compensated by the variation of other p-n junctions in accordance with accepted integrated circuit design.

Electric power supply 10 is further connected through a resistor 18 to the collector of an NPN transistor 19, the emitter of which is connected to the emitter of another NPN transistor 20 and through a resistor 21 to ground. Transistors 19 and 20 therefore form a differential emitter-coupled pair of the type often used in integrated circuits. The collector of transistor 20 is connected to the base of transistor 19 and further through a resistor 23 to junction 16. The base of transistor 20 is connected through a resistor 24 to junction 16.

A tank circuit 26, which may be external to the integrated circuit which forms the remainder of the oscillator, comprises, in this embodiment, a capacitor 27 and inductor 28 in parallel. The capacitor 27 may actually be a varactor diode which exhibits a capacitance depending on the DC or average voltage thereacross. Tank circuits including such varactor diodes are now well known in the art and may be found in the electronically tuned radio manufactured by the assignee of this invention. Tank circuit 26 is external to the integrated circuit and has one output 29 connected to ground and another output 30 connected to the cathode of a diode 31, the anode of which is connected to the base of a PNP transistor 32. The collector of transistor 32 is grounded, and the emitter is connected to the base of transistor 19.

A PNP transistor 33 has an emitter connected to the base of transistor 20, a grounded collector and a base connected through a forward biased diode 34 to ground. Transistors 32 and 33, as well as diodes 31 and 34, are matched as closely as possible in the integrated circuit so that their p-n junction voltages will vary similarly with temperature. Thus, the base of transistor 20 will be maintained at a two diode-drop level above ground and the base of transistor 19 will be maintained at a substantially equivalent two diode-drop level above the tank circuit. As the tank circuit oscillates, the voltage at output 30 will oscillate above and below ground;

and therefore the voltage on the base of transistor 19 will oscillate similarly above and below the voltage on the base of transistor 20. If the base voltage of either transistor 19 or transistor 20 exceeds the base voltage of the other by a rather small margin such as 140 to 160 millivolts, that transistor will conduct current strongly and the other will be substantially cut off. Therefore, the alternate conduction of transistors 19 and 20 will be controlled by and timed to the oscillation of tank 26. Due to the characteristic small switch-over voltage differential of transistors 19 and 20, this control can be accomplished with a rather small voltage swing.

In the operation of the circuit, as the voltage at output 30 of tank 26, and therefore also on the base of transistor 19 rises, transistor 19 eventually turns on and transistor 20 turns off. Current flows through resistor 11, resistor 23, the emitter base junction of transistor 32 and diode 31 into the tank 26 to charge up capacitor 27 and establish a current flow through inductor 28. The portion of the current from resistor 23 flowing to tank 26 increases as the alternate current path through transistor 20 is shut off; and this provides an extra charging boost to capacitor 27 at the proper time to add energy to the tank circuit. As the voltage on the base of transistor 19 increases while the voltage of junction 16 remains constant; however, the voltage across resistor 23 decreases with a resulting decrease in current to the tank 26. Inductor 28 attempts to maintain its current flow and thus draws current from capacitor 27 to start the voltage at the base of transistor 19 downward again.

When the voltage of the base of transistor 19 becomes low enough that transistor 20 turns on and transistor 19 turns off, transistor 20 and resistor 21 divert a proportion of the current from resistor 23 away from tank 26 and thus cause inductor 28 to pull additional current from capacitor 27, which causes the voltage at output 30 to reach its lowest point below ground. Eventually, however, the current through inductor 28 decreases and reverses and capacitor 27 begins to charge positively with respect to ground and thus repeat the cycle.

Thus, it can be seen that the emitter-coupled pair of transistors 19 and 20 is switched by the tank circuit in time with tank circuit oscillations and, in turn, controls the flow of current and therefore energy to the tank circuit in such a way as to reinforce the oscillations. Since the emitter-coupled pair of transistors 19 and 20 requires only a small voltage swing to accomplish its switching, the tank circuit may also have a small voltage swing. Therefore, the "beta" current reduction factor of the emitter-base junction of transistor 32 is utilized to reduce the current flow to the tank 26 to a low level so that the voltage swings of tank 26 will be maintained at a low level.

The output of the oscillator may be taken as a low level, sinusoidal, double-ended output across output terminals 35 and 36, which correspond to the bases of transistors 19 and 20, respectively. The output will not be truly balanced, since the voltage at output terminal 36 will vary very little with respect to ground while the voltage at output terminal 35 exhibits the full oscillation of tank circuit 26. However, the signal from terminals 35 and 36 is suitable for application to certain mixer circuits, including particularly a double balanced integrated circuit mixer. If a high level output is required for application, for example, to a frequency synthesizer in a phase locked loop circuit, an emitter follower NPN transistor 37 may have a collector connected to electric power supply 10 and a base connected to the collector of transistor 19. The emitter of transistor 37 will then provide the desired high level output from the oscillator, even though the tank circuit is oscillating at a low level. The high level output will, of course, exhibit less the form of a pure sign wave than the low output, since it is taken from the collector of transistor 19. However, for such purposes as a frequency synthesizer, this does not matter.

The embodiment of this invention as described above is preferred but is not the only embodiment possible. Equivalent embodiments are also contemplated; and the invention is described by the claim which follows.

The embodiments of the invention in which an exclusive property or privilege is claimed are defined as follows:

1. A low level oscillator suitable for use as a radio receiver local oscillator and adaptable to integrated circuit construction comprising, in combination:

first and second differentially connected transistors, each having a base and the second having a collector connected to the base of the first;

first means including a third transistor with a base-emitter junction effective to establish a first reference voltage relative to ground on the second transistor base and supply electric current thereto;

a fourth transistor having an emitter connected to the first transistor base, a grounded collector and a base;

an LC tank coupled between the fourth transistor base and ground;

second means cooperating with the fourth transistor base-emitter junction to maintain the voltage on the first transistor base higher by the first reference voltage, in spite of temperature variation, than the voltage across the tank, whereby alternate conduction of the first and second transistors is timed to tank oscillation;

a source of electric power having a second reference voltage higher than the first and being effective to deliver electric current;

impedance means connecting the electric power source to the first transistor base, whereby current is supplied alternately to the tank and the second transistor in proper timing and phase to maintain tank oscillation, the fourth transistor reducing the magnitude of tank voltage oscillation to a low level.

* * * * *

UNITED STATES PATENT AND TRADEMARK OFFICE

CERTIFICATE OF CORRECTION

PATENT NO. : 4,243,954

DATED : January 6, 1981

INVENTOR(S) : Burtron D. Schertz and Fredrick A. Aldridge

It is certified that error appears in the above—identified patent and that said Letters Patent is hereby corrected as shown below:

On the cover page at [75] "Frederick A. Aldridge" should read -- Fredrick A. Aldridge --.

Signed and Sealed this

Fourteenth Day of April 1981

[SEAL]

Attest:

RENE D. TEGTMEYER

Attesting Officer     Acting Commissioner of Patents and Trademarks